TRANSISTOR PROTECTION CIRCUIT

Filed Aug. 31, 1964

INVENTOR.
CARL F. WHEATLEY, JR
BY [signature]

ATTORNEY

1

3,390,346

TRANSISTOR PROTECTION CIRCUIT

Carl F. Wheatley, Jr., Somerset, N.J., assignor to Radio Corporation of America, a corporation of Delaware Filed Aug. 31, 1964, Ser. No. 393,039
10 Claims. (Cl. 330—11)

ABSTRACT OF THE DISCLOSURE

A Class A transistor amplifier including a diode by-pass circuit providing transistor protection against voltage breakdown caused by the large reaction voltage generated in a transformer load when an applied input signal suddenly cuts the transistor off.

This invention relates in general to transistor amplifier circuits and more particularly to transistor audio power amplifier circuits for phonographs, radio receivers and the like.

Presently available line-operated equipment using low voltage transistors require the use of either a power transformer or a voltage dropping resistor having substantial power rating to reduce the line voltage to a safe operating level. The recent introduction of high voltage transistors permits a cost savings by allowing the circuits to be operated at higher voltages and lower currents for a comparable power output thereby eliminating the need for such power transformers or large voltage dropping resistors.

In the design of transistor amplifier circuits it is important that the collector voltage rating of the transistor be maintained within the specified rating. With commercially available high voltage transistors, the collector voltage rating is about 300 volts or about twice the peak voltage derived from a half wave rectifier circuit powered from the alternating current (A-C) mains. In the case of an audio power amplifier driving an output transformer, the collector voltage swing under normal operation approaches twice that of the collector supply voltage. However, under transient conditions where the transistor is rapidly cut off, the reaction voltage generated in the transformer winding due to the collapse of the transformer field causes the collector voltage to increase to several times that of the power supply voltage. In accordance with present design techniques, the power voltage is reduced to provide sufficient safety factors to prevent the exceeding of the collector voltage rating. Such a design limits the maximum gain and power output from the stage, and in addition defeats the advantages that are obtained from a high voltage low current type power supply.

It is therefore an object of this invention to provide a new and improved low cost protection circuit for inductively loaded transistor circuits.

It is also an object of this invention to provide a new and improved circuit for protecting high voltage transistor audio power amplifier circuits against breakdowns caused by exceeding the collector rating of the transistor by input transients.

It is still a further object of this invention to provide a new and improved circuit for protecting line-operated transformer-loaded high voltage transistor audio power amplifier circuits against transient over-voltage collector breakdown.

An audio power amplifier circuit embodying the invention includes a high voltage transistor driving an audio output transformer having first and second winding portions. A rectifier device coupled to one of the winding portions, becomes conductive when the transistor collector voltage exceeds a predetermined value. Conduction by the rectifier device causes the stored energy largely to dissipate in that winding portion and thereby limits the peak voltage excursion at the collector electrode.

2

Figures 1, 2, 3:
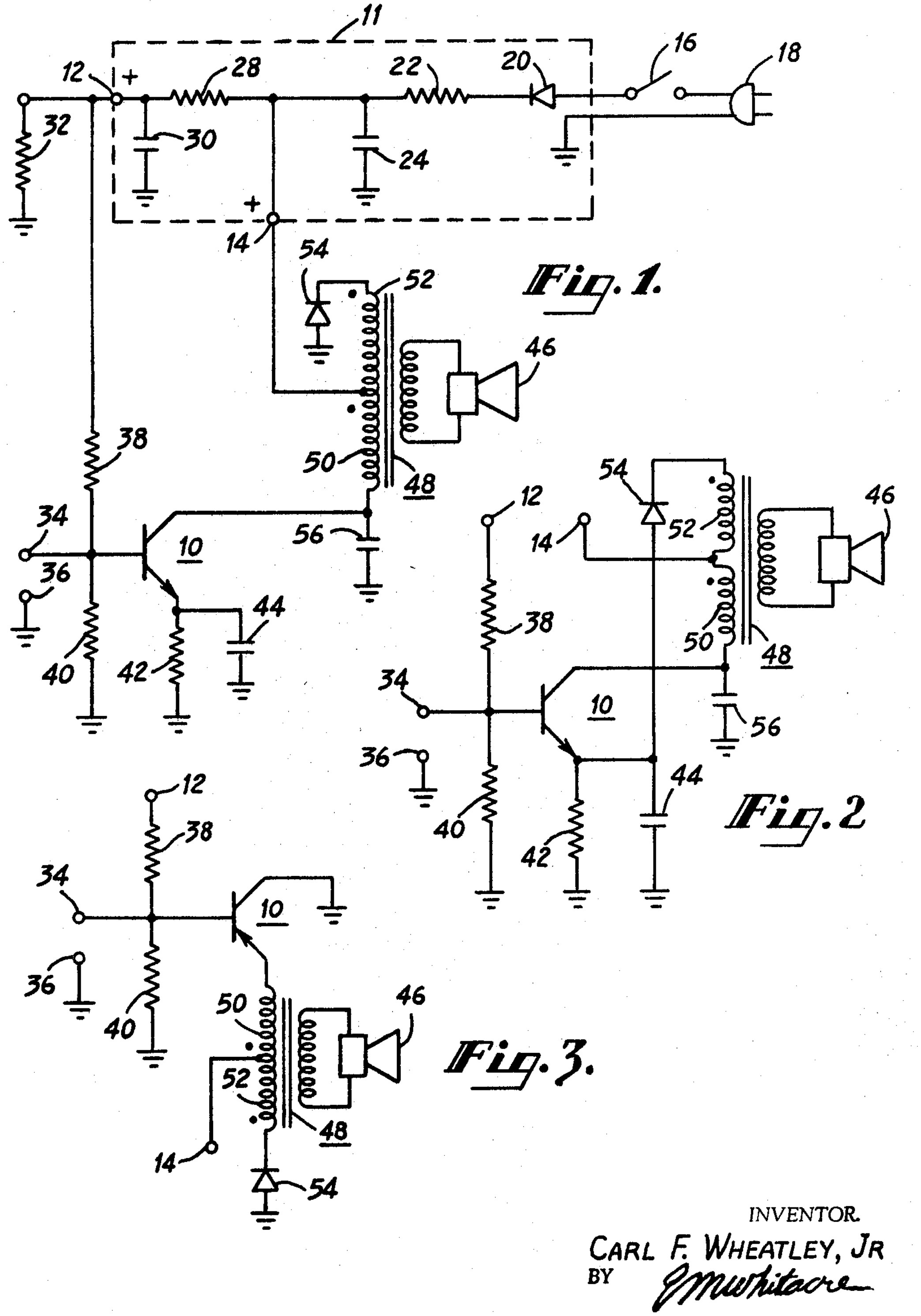
FIGURE 1 is a circuit diagram of an amplifying circuit embodying the invention.
FIGURE 2 is a circuit diagram illustrating a modification of the circuit of FIGURE 1.
FIGURE 3 is a circuit diagram illustrating another modification of FIGURE 1.

The audio power amplifier stage for use in line-operated electronic equipment (FIGURE 1) includes a high voltage NPN transistor 10 which is connected for energization to a low voltage terminal 12 and to a high voltage terminal 14 of a direct current power supply 11 (shown contained within a dashed block). The power supply 11 is coupled through an on-off switch 16 to a plug 18 which is adapted to be connected to any alternating current (A-C) wall socket.

When the switch 16 is closed, the A-C power line voltage is rectified by a rectifier 20 and filtered by a series resistor 22 and a shunt capacitor 24. The filtered voltage that appears across the capacitor 24 comprises the high voltage output at the terminal 14 which, in the present embodiment, is about 145 volts D-C positive with respect to a common connection indicated by the conventional ground symbol. A further filtering network including a series resistor 28 and a shunt capacitor 30 provides the low voltage output at the terminal 12 which, in the present embodiment is about nine volts positive with respect to ground. The voltage at the terminal 12 may be used to energize the low level amplifier stages preceding the power amplifier. These stages are represented by an equivalent load resistor 32.

Input signals to be amplified are applied to the base of transistor 10 through a pair of input terminals 34 and 36. A pair of resistors 38 and 40 are connected between the low voltage terminal 12 of power supply 11 and ground providing the appropriate base biasing potential. The emitter electrode of transistor 10 is connected to ground through a parallel biasing network including a resistor 42 and an audio bypass capacitor 44.

The amplifier is coupled to drive a loudspeaker 46 through an output transformer 48. The output transformer 48 includes a primary winding having a first and a second portion 50 and 52 connected between the collector electrode of the transistor 10 and the cathode of a rectifying diode device 54. The junction of the winding portions 50 and 52 is connected to the high voltage terminal 14 which provides the collector power supply voltage for the transistor 10. The anode of diode 54 is connected to ground. The diode 54 is quiescently reverse biased by the voltage at the high voltage terminl 14.

With a sine wave type input signal applied to the input terminals 34 and 36, the maximum collector voltage swing that can be developed at the collector electrode of the transistor 10 approaches twice the value of the voltage at the high voltage terminal 14. As a result, the maximum value of the power supply voltage that is used to energize such an inductively loaded circuit is limited to no more than one half the maximum collector to base reverse voltage rating of the transistor employed. Furthermore, an allowance is generally incorporated in the value of the power supply as a safety factor to allow for some protection against transients, line voltage variations, component variations etc.

If a transient input signal suddenly cuts off transistor 10 a high reactive voltage is induced in the primary winding portion 50 by the collapsing transformer field. The reactive voltage has a polarity that tends to keep the current flowing in the same direction as before cutoff and adds to the voltage at the high voltage terminal 14. The reactive voltage continues until the energy stored in the transformer 48 and the winding of the speaker 46 is dissipated. Without some sort of circuit protection this stored energy is dissipated by transistor 10. This reactive phenomenon is well-known and needs no further explanation here.

Without the protection of the diode 54, the reactive voltage exceeds the value of the power supply voltage by several magnitudes, depending upon many factors such as the rate of cut off, the inductance of the transformer, the coefficient of coupling, etc. The design problem of maintaining the collector voltage within the specified rating is even more difficult of solution if the transient input signal drives the transistor 10 into saturation and thereafter rapidly into cut off wherein a "worse case condition" occurs involving a maximum of stored transformer energy. Such transient inputs can be introduced into a receiver by radiation due to electrical storms or to fluorescent lighting. A same effect can be accomplished by suddenly tuning the receiver to a strong signal from a local station wherein the output circuit is driven into saturation and then sequentially into cut off before the automatic volume control circuit can take control. In any case, whether cut off while saturated or not, the reactive voltage in inductively loaded transistor circuits may be sufficient to destroy the transistor 10 or drastically degrade its operation.

The protection afforded by the diode 54 and the winding portion 52 will best be understood by reference to the polarities of the various components of FIGURE 1. The primary winding of the transformer 48 is wound or poled in a manner so that the same polarity of voltage appears across the winding portion 52 as does appear across the winding portion 50, as indicated by the conventional polarity dots. The two portions may be wound in the same direction. For example, if the transistor 10 is conducting and then suddenly cut off, a reactive voltage appears across the winding portion 50 having a polarity that adds to power supply 11, i.e., positive at the collector electrode with respect to the terminal 14, in the illustrated circuit. The resultant current also induces a voltage across the winding portion 52 that has a polarity that subtracts from power supply 11, i.e. positive at terminal 14 with respect to the cathode of the diode 54. When the voltage generated across the winding portion 52 is greater than the magnitude of voltage at the high voltage terminal 14, the diode 54 switches into conduction causing a current flow through the winding portion 52 and the power supply 11, thereby bypassing the transistor 10. The conduction of the diode 54 provides a severe load on transformer 48 and prevents any further voltage increases across the winding portion 50 by dissipating the reactive energy stored in the transformer.

Generally, the leakage inductance of the transformer 48 is sufficiently low and the switching of the diode 54 is sufficiently fast to prevent any damage to the transistor 10 due to such reactive voltage. Further protection can be given to the transistor 10 by connecting a small capacitor 56 (high impedance to signal frequencies) between the collector electrode and ground. This capacitor bypasses some of the transient voltage that many otherwise appear across the collector electrode of the transistor 10 before the diode 54 takes control.

For maximum power output from the circuit of FIGURE 1, it is desired that the turns ratio between the winding portions 52 and 50 be approximately unity. In such a case the collector-to-emitter voltage of transistor 10 can effectively swing from 0 volts to twice the voltage at the high voltage terminal 14, allowing for maximum amplitude output without the limiting effect of the diode 54. With the unity turns ratio, the voltage induced across the winding portion 52 is slightly greater than the magnitude of voltage at the high voltage terminal 14 before diode 54 conducts.

The circuit is not limited to a unity turns ratio, but can be set to any value depending upon the degree of overvoltage protection desired for a given circuit. By increasing the turns ratio, that is increasing the number of transformer windings in winding portion 52 over that in winding portion 50, the circuit may be protected for voltage excursions at the collector electrode having an amplitude of less than twice the value of the voltage at the high voltage terminal 14. By decreasing the above mentioned turns ratio, the diode may be caused to conduct for voltage excursions that are greater than twice the value of the voltage at the high terminal 14.

The protection circuit described above permits the output stage to operate safely with a considerably higher collector voltage, thereby realizing an increase in gain and power output by making use of the percentage of power supply voltage previously set aside as a design safety factor. With the circuit of FIGURE 1, an audio output transistor such as the TA2301 available from the Radio Corporation of America safely operates from a 145 volt power supply with a 5500 ohm load producing an output of one and a half watts with low distortion. Furthermore, the circuit can be operated with a lesser load, or if the load accidentally is disconnected, the circuit is still protected, because the diode 54 also conducts to prevent any excessive collector voltage that occurs as a result of a reduced or disconnected load.

The circuit of FIGURE 1 can be modified as shown in FIGURE 2 by connecting the anode of the diode 54 to the junction of the emitter electrode of the transistor 10 with the grounded biasing resistor 42 and the signal bypass capacitor 44. The circuit of FIGURE 2 effectively operates in the same manner as previously described in regards to FIGURE 1 with the exception that the positive biasing voltage developed across the resistor 42-capacitor 44 biasing circuit allows the diode 54 to conduct at a slightly lower reactive voltage, the difference being set by the magnitude of the biasing voltage developed.

The protection circuit applys equally as well in an emitter-follower PNP transistor circuit shown in FIGURE 3 in which the inductive load is directly connected to the emitter electrode. In this circuit, the diode and transformer polarities are again arranged for diode conduction whenever the transistor suddenly cuts off and the collector-to-emitter voltage reaches a predetermined level as previously mentioned in regard to FIGURE 1.

What is claimed is:

1. A Class A audio amplifier comprising:

a transistor having base, emitter and collector electrodes;

means providing an input circuit coupled between said base and emitter electrodes;

an output circuit including a transformer having mutually coupled first and second winding portions;

means including an operating potential supply source connecting said first winding portion between said emitter and collector electrodes;

a rectifying device connected in series with said second winding portion, and means for applying a reverse bias to said rectifying device through said second winding portion of a value to cause said rectifying device to become forward biased only when the voltage at said collector electrode exceeds a predetermined level in response to an applied input signal.

2. An amplifier circuit comprising:

a transistor having base, collector and emitter electrodes;

input circuit means connected between said base and emitter electrodes;

output circuit means including a transformer having a plurality of winding portions, a first winding portion of said plurality of winding portions being connected between said collector and emitter electrodes, said first winding portion and a second winding portion of said plurality of winding portions being connected to a source of energizing potential, and a diode connected to said second winding portion, said diode being connected to be reverse biased by said source of energizing potential, said transformer winding portions being so poled that said diode conducts through said second winding when a predetermined magnitude voltage is developed at said collector electrode in response to an applied input signal, said diode conduction providing a stored energy dissipation path for bypassing said transistor thereby limiting any further increase in the voltage developed at said collector electrode.

3. A Class A audio amplifier circuit comprising:

a semiconductor amplifying device having a plurality of electrodes;

means for applying an input signal to said amplifying device;

a transformer load having mutually coupled first and second winding portions;

means for coupling an output signal from said transformer load;

means, including a source of energizing potential, connecting said first winding portion in a current path including at least a pair of said electrodes and said source of energizing potential;

a rectifying device connected in series with said second winding portion; and means for applying a reverse bias to said rectifying device through said second winding portion of a value to cause said rectifying device to become forward biased to provide a stored energy dissipation path for said transformer load that bypasses said amplifying device only when the voltage across the electrodes in said current path including said source of energizing potential exceeds a predetermined level in response to an applied input signal.

4. An over-voltage protection circuit for a Class A amplifier circuit, said amplifier circuit including a transistor having an input circuit connected between the transistor base and emitter electrodes, an output circuit for connection to a source of energizing potential, including a transformer having a plurality of winding portions, one of said winding portions being connected in the current path between said collector electrode, emitter electrode and said source of energizing potential, said protection circuit comprising:

a second winding portion on said transformer having first and second terminals, said first terminal being arranged for connection to said source of energizing potential; and a diode having first and second terminals, said first terminal of said diode being connected to said second terminal of said second winding portion, said second terminal of said diode being connected to said transistor emitter electrode to back bias said diode by said source of energizing potential, said transformer winding portions being poled so that said diode conducts through said second winding portion when said transistor current decreases and the resultant induced voltage at said transistor collector electrode reaches a predetermined level in response to an applied input signal.

5. A Class A audio amplifier circuit comprising:

a transistor having base, collector and emitter electrodes;

circuit means coupling said emitter electrode to a point of reference potential;

a source of energizing potential having two output terminals, one of said output terminals being connected to said point of reference potential;

input circuit means connected between said base electrode and said point of reference potential;

biasing means including a portion of said input circuit means for biasing said transistor into Class A operation;

a transformer having a primary winding with a first, second and third terminals, said first and third terminals being connected to opposite ends of said primary winding and said second terminal connected at an intermediate point between the ends of said primary winding;

said first and second terminals being connected between said collector electrode and said other terminal of said source of energizing potential, and a diode having one terminal connected to said point of reference potential and the other terminal connected to said third terminal of said primary winding so that said source of energizing potential reverse biases said diode by an amount such that said diode becomes forward biased to provide a stored energy dissipation path bypassing said transistor when a predetermined magnitude voltage is developed at said collector electrode in response to an applied input signal.

6. A transient protection circuit for a transistor having a signal input circuit, and a signal output circuit including an inductive component connected in the current path between the output electrodes of the transistor by a source of energizing potential, said protection circuit comprising:

a diode;

inductive means connected to said diode and forming a series current path therewith for coupling a voltage thereto that is a function of the voltage developed across said inductive component in response to an applied input signal;

and biasing means connected across said diode and said inductive means for reverse-biasing said diode;

said inductive means and said biasing means being so poled that said diode becomes conductive through said inductive means when an applied input signal causes the voltage developed across said inductive component to reach a predetermined level.

7. A Class A audio amplifier comprising:

a transistor having base, emitter and collector electrodes;

means coupled between said base and emitter electrodes for supplying input signals to be amplified;

a transformer having a secondary winding and a tapped primary winding providing first and second mutually coupled winding portions;

means coupled to said secondary winding for deriving amplified output signals corresponding to said supplied signals;

means including an operating potential supply source connecting said first primary winding portion between the emitter and collector electrodes of said transistor;

a rectifier having anode and cathode electrodes;

and means including said operating potential supply source connecting said second primary winding portion between the anode and cathode electrodes of said rectifier;

said rectifier and said first and second primary winding portions being so poled that said operating potential supply source reverse biases said rectifier through said second primary winding portion until a predetermined magnitude voltage is developed at said collector electrode in response to an applied input signal, at which time said rectifier becomes forward biased and conducts through said second winding portion.

8. A Class A audio amplifier as defined in claim 7 wherein said predetermined magnitude voltage substantially corresponds to the breakdown voltage exhibited by said transistor.

9. A Class A audio amplifier as defined in claim 7 wherein the value of said operating potential supply source substantially equals one-half the breakdown voltage exhibited by said transistor.

10. A Class A audio amplifier as defined in claim 7 wherein said operating potential supply source is connected to the tap on said primary winding, wherein said first and second primary winding portions are poled so that the same polarity of voltage appears across each of said winding portions and wherein said rectifier is poled so that it becomes forward biased when the voltage generated across said second primary winding portion in response to an applied input signal exceeds the value of said operating potential supply source.

References Cited

UNITED STATES PATENTS

| | | | |
|---|---|---|---|
| 3,015,781 | 1/1962 | Eklov | 330—11P |
| 3,262,063 | 7/1966 | Kleinman | 330—22 X |

ROY LAKE, *Primary Examiner.*

L. J. DAHL, *Assistant Examiner.*